(12) United States Patent
Shirasaka et al.

(10) Patent No.: US 7,607,355 B2
(45) Date of Patent: Oct. 27, 2009

(54) SEMICONDUCTOR DEVICE

(75) Inventors: Kenichi Shirasaka, Hamamatsu (JP);
Yukitoshi Suzuki, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 0 days.

(21) Appl. No.: 12/069,539

(22) Filed: Feb. 11, 2008

(65) Prior Publication Data
US 2008/0229840 A1 Sep. 25, 2008

(30) Foreign Application Priority Data
Feb. 16, 2007 (JP) .......................... P2007-036294

(51) Int. Cl.
*G01L 9/00* (2006.01)
(52) U.S. Cl. ................... 73/754; 361/283.4; 257/704
(58) Field of Classification Search ............ 73/754; 361/283.4; 257/704
See application file for complete search history.

(56) References Cited

U.S. PATENT DOCUMENTS

| | | | | |
|---|---|---|---|---|
| 4,838,089 A | * | 6/1989 | Okada et al. ................... 73/727 |
| 5,097,841 A | * | 3/1992 | Moriuchi et al. ............. 600/488 |
| 5,859,759 A | * | 1/1999 | Moriyama et al. ........ 361/283.4 |
| 5,960,260 A | * | 9/1999 | Umehara et al. ............. 438/118 |
| 5,978,222 A | * | 11/1999 | Iijima et al. ................. 361/704 |
| 6,088,233 A | * | 7/2000 | Iijima et al. ................. 361/760 |
| 6,232,652 B1 | * | 5/2001 | Matsushima ................. 257/667 |
| 6,347,037 B2 | * | 2/2002 | Iijima et al. ................. 361/704 |
| 6,781,231 B2 | | 8/2004 | Minervini |
| 2002/0001178 A1 | * | 1/2002 | Iijima et al. ................. 361/704 |

FOREIGN PATENT DOCUMENTS

JP S62-20343 2/1987
JP 2004-537182 12/2004

OTHER PUBLICATIONS

Office Action issued May 26, 2009, on the counterpart Korean Patent Application No. Oct. 2008-0013121 and partial English translation thereof.

* cited by examiner

*Primary Examiner*—Andre J Allen
(74) *Attorney, Agent, or Firm*—Pillsbury Winthrop Shaw Pittman LLP

(57) ABSTRACT

A semiconductor device is equipped with a semiconductor sensor chip for detecting pressure variations that is arranged inside of a hollow cavity of a housing, wherein an opening is formed in a prescribed region of the housing, which is not positioned opposite to the semiconductor sensor chip, so as to allow the hollow cavity to communicate with an external space. The opening is formed using at least one through-hole having a thin slit-like shape. Alternatively, the opening is formed using plural through-holes each having a desired shape such as a thin slit-like shape, a circular shape, and a sectorial shape. Thus, it is possible to reduce negative influences due to environmental factors such as dust and sunlight with respect to the semiconductor sensor chip.

11 Claims, 5 Drawing Sheets

SEMICONDUCTOR DEVICE

BACKGROUND OF THE INVENTION

1. Field of the Invention

The present invention relates to semiconductor devices in which semiconductor sensor chips such as microphone chips and pressure sensor chips are arranged inside of hollow cavities.

This application claims priority on Japanese Patent Application No. 2007-36294, the content of which is incorporated herein by reference.

2. Description of the Related Art

Conventionally-known semiconductor devices, examples of which are disclosed in U.S. Pat. No. 6,781,231 and Japanese Patent Application Publication No. 2004-537182, are each designed such that a substrate having a chip mount surface for mounting a semiconductor sensor chip for detecting pressure variations such as variations of sound pressures is covered with a cover member, so that the semiconductor sensor chip is arranged inside of a hollow cavity defined by the substrate and the cover member. The cover member has an opening allowing the cavity to communicate with external space; hence, pressure variations occurring in external space are transmitted to the semiconductor sensor chip via the opening of the cover member. The opening of the cover member is positioned opposite to the semiconductor sensor chip and is normally formed in a circular shape.

When the opening of the cover member is positioned opposite to the semiconductor sensor chip arranged inside of the cavity of the semiconductor device, the semiconductor sensor chip must be directly exposed to the external space via the opening and is thus easily affected by environmental factors such as sunlight and dust.

Normally, a single opening, which is formed in a circular shape in plan view, is formed at a prescribed position of the cover member, which is directly opposite to a diaphragm of the semiconductor sensor chip. In order to adequately introduce pressure variations into the cavity of the semiconductor device, it is necessary to sufficiently increase the opening area; however, when the opening area is increased, negative influences (or negative effects) due to environmental factors will be correspondingly increased. When the opening is formed in a circular shape, a drawback may likely occur such that small foreign matters smaller than the diameter of the opening may be easily introduced into the cavity of the semiconductor device.

In order to protect semiconductor sensor chips from negative influences due to environmental factors, some conventionally-known semiconductor devices are equipped with environmental barriers for avoiding infiltration of environmental factors. However, environmental barriers make it complex to produce semiconductor devices in manufacturing.

SUMMARY OF THE INVENTION

It is an object of the present invention to provide a semiconductor device that can reduce negative influences due to environmental factors with respect to a semiconductor sensor chip without using an independent member serving as an environmental barrier.

In a first aspect of the present invention, a semiconductor device includes a semiconductor sensor chip for detecting pressure variations, a housing having a hollow cavity, in which the semiconductor sensor chip is arranged, and an opening including a plurality of through-holes, which are collectively formed in a prescribed region of the housing that is not positioned opposite to the semiconductor sensor chip, wherein the opening allows the hollow cavity to communicate with the external space.

In the above, the through-holes are collectively arranged to adjoin each other in a concentrated manner in the prescribed region of the housing, e.g., a prescribed region of a top board member. The opening can be formed using one through-hole having a thin slit-like shape; alternatively, the opening is formed using a plurality of through-holes each having a thin slit-like shape.

Since the opening is formed using a plurality of through-holes, it is possible to secure a sufficiently large overall area of the opening corresponding to the sum of opening areas of through-holes even when each of the through-holes is reduced in opening area. This allows pressure variations such as variations of sound pressure to be introduced into the cavity to reach the semiconductor sensor chip. Since the plural through-holes are collectively arranged within the prescribed region of the housing, it is possible for pressure variations to propagate into the cavity in a desired condition, which is similar to the propagation condition of pressure variations applied to a single large through-hole.

When the opening is constituted of the through-hole having a thin slit-like shape, it is possible to secure a sufficiently large opening area while reducing the width of the through-hole. This allows pressure variations to reliably propagate into the cavity via the opening so as to reach the semiconductor sensor chip.

By reducing the opening area of each through-hole or by reducing the width of the through-hole, it is possible to easily prevent dust from entering into the cavity of the housing. Since the opening is formed in the prescribed region of the housing that is not positioned opposite to the semiconductor sensor chip, it is possible to easily prevent sunlight from being introduced into the cavity so as to reach the semiconductor sensor chip. That is, it is possible to remarkably reduce negative influences due to environmental factors such as dust and sunlight with respect to the semiconductor sensor chip.

When the opening is formed using a plurality of through-holes each having a thin slit-like shape, the through-holes can be arranged close to each other so that the housing is reduced in size, thus downsizing the semiconductor device. Due to the formation of plural through-holes, each of which can be reduced in opening area, it is possible to further reduce negative influences due to environmental factors with respect to the semiconductor sensor chip.

In a second aspect of the present invention, a semiconductor device includes a semiconductor sensor chip for detecting pressure variations, a substrate having a chip mount surface for mounting the semiconductor sensor chip, and a cover member that is combined with the substrate so as to form a hollow cavity, in which the semiconductor sensor chip is arranged, wherein at least a prescribed part of the cover member is composed of a porous material. The porous material includes numerous small cavities, which mutually communicate with each other and by which the cavity communicates with the external space.

In the above, pressure variations are introduced into the hollow cavity via small cavities of the porous material forming the cover member so as to reach the cover member. Since the cover member is composed of the porous material, it is possible to easily prevent dust from entering into the hollow cavity, and it is possible to easily prevent sunlight from propagating into the hollow cavity. This may substantially eliminate negative influences due to environmental factors such as dust and sunlight with respect to the semiconductor sensor chip.

As described above, the present invention is capable of remarkably reducing negative influences due to environmental factors such as dust and sunlight with respect to the semiconductor sensor chip without using an independent member serving as an environmental barrier.

BRIEF DESCRIPTION OF THE DRAWINGS

These and other objects, aspects, and embodiments of the present invention will be described in more detail with reference to the following drawings, in which.

DESCRIPTION OF THE PREFERRED EMBODIMENT

The present invention will be described in further detail by way of examples with reference to the accompanying drawings.

Figure 1:
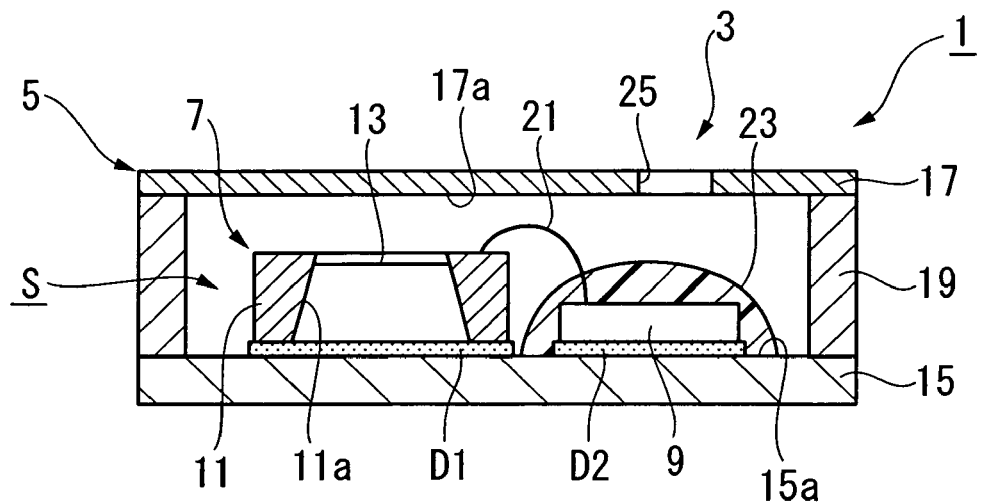
FIG. 1 is a longitudinal sectional view showing the constitution of a semiconductor device in accordance with a preferred embodiment of the present invention.

A semiconductor device 1 according to a preferred embodiment of the present invention will be described with reference to FIGS. 1 and 2. The semiconductor 1 is basically designed to form a microphone package, which includes a hollow cavity S and a housing 5 having an opening 3 that communicates with the external space via the cavity S as well as a microphone chip 7 and an LSI chip 9 both arranged inside of the cavity S.

The microphone chip 7 is composed of silicon and is equipped with a diaphragm 13 for covering an inner hole 11a of a support 11. The diaphragm 13 detects pressure variations such as sound pressure variations by way of vibration thereof, so that the microphone chip 7 forms a sound pressure sensor chip for converting vibration of the diaphragm 13 into electric signals.

The LSI chip 9 drives and controls the microphone chip 7 and is constituted of an amplifier for amplifying electric signals output from the microphone chip 7, an A/D converter for converting electric signals into digital signals, and a digital signal processor (DSP).

The housing 5 is constituted of a substrate 15 having a rectangular plate-like shape, in which the microphone chip 7 and the LSI chip 9 are mounted on a chip mount surface 15a, and a top board member 17 having a rectangular plate-like shape, which is positioned in parallel with and vertically distanced from the chip mount surface 15a of the substrate 15, and a side wall member 19 whose lower end is fixed to the periphery of the chip mount surface 15a of the substrate 15 and whose upper end is fixed to the periphery of an interior wall 17a of the top board (which is positioned opposite to the chip mount surface 15a). The top board member 17 composed of nickel silver serves as a cover member for covering the microphone chip 7 and the LSI chip 9 mounted on the chip mount surface 15a of the substrate 15, thus defining the cavity S embracing the microphone chip 7 and the LSI chip 9 together with the substrate 15 and the side wall member 19.

The substrate 15 is a multilayered wiring substrate embedding electric wiring (not shown) therein. The microphone chip 7 is mounted on the chip mount surface 15a via a die-bonding material D1 in such a way that the diaphragm 13 is positioned opposite to the chip mount surface 15a of the substrate 15 via the inner hole 11a of the support 11.

Similar to the microphone chip 7, the LSI chip 9 is mounted on the chip mount surface 15a of the substrate 15 via a die-bonding material D2 so as to adjoin the microphone chip 7.

The microphone chip 7 and the LSI chip 9 are electrically connected together via a wire 21. The LSI chip 9 is electrically connected to a prescribed portion of the wiring of the substrate 15, which is exposed on the chip mount surface 15a, via a wire (not shown).

A resin seal 23 is formed to entirely seal the LSI chip 9 and to partially seal the wire 21 connected to the LSI chip 9. That is, the LSI chip 9 is not exposed to the external space and is protected by means of the resin seal 23. It is preferable that the resin seal 23 be composed of a resin material having a relatively low elastic modulus (causing a relatively low stress) such as a silicon resin, wherein a melted resin material is subjected to potting in which it is flowed over the chip mount surface 15a of the substrate 15.

The opening 3 allowing the cavity S to communicate with the external space is formed using a through-hole 25 that is formed to run through the top board member 17 in its thickness direction, wherein the through-hole 25 is formed within a prescribed region of the top board member 17 positioned opposite to the LSI chip 7. Specifically, as shown in FIG. 2, the through-hole 25 is formed in a thin slit-like shape in plan view, wherein the longitudinal direction of the through-hole 25 is substantially perpendicular to the radial direction of the diaphragm 13 that is directed towards the through-hole 25 in plan view.

In addition, the longitudinal direction of the through-hole 25 is substantially perpendicular to the alignment direction of the microphone chip 7 and the LSI chip 9. In FIG. 2, the through-hole 25 is formed in a thin rectangular shape, which is not a restriction. For example, the through-hole 25 can be formed in a slit-like shape having round corners.

In order to adequately transmit pressure variations (e.g., sound pressure variations) towards the microphone chip 7 arranged inside of the cavity S of the semiconductor device 1, it is necessary to increase the area of the opening 3 to be equal to or larger than a prescribed area (e.g., approximately 0.785 mm$^2$). In the semiconductor device 1 of the present embodiment compared with the conventionally-known semiconductor device having a circular opening, the through-hole 25 is formed in a thin rectangular shape whose width is reduced.

For example, when the area of the opening 3 is set to 0.785 mm$^2$, the conventionally-known circular opening is designed with a diameter of 1.0 mm, while the through-hole 25 having a thin rectangular shape is designed with a length of 1.57 mm and a width of 0.5 mm; that is, through-hole 25 is designed with prescribed dimensions in which the ratio between the length and the width is approximately set to 3:1. This makes it possible to reduce the width of the rectangular opening 3 to a half of the diameter of the conventionally-known circular opening.

Figure 2:
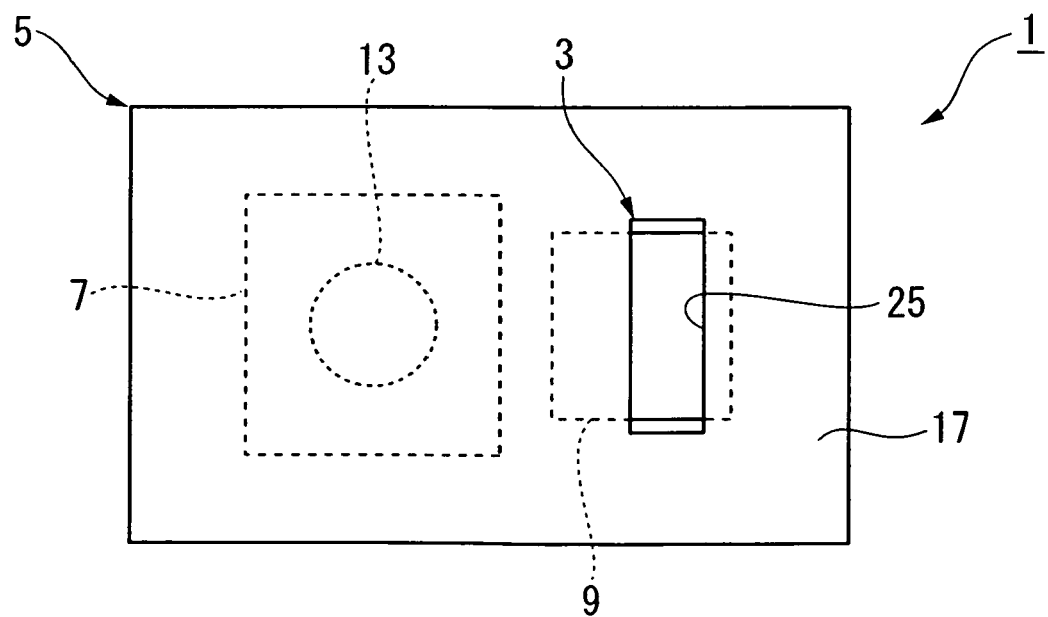
FIG. 2 is a plan view of the semiconductor device in which a microphone chip having a diaphragm is positioned relative to an opening of a housing.
Figure 3:
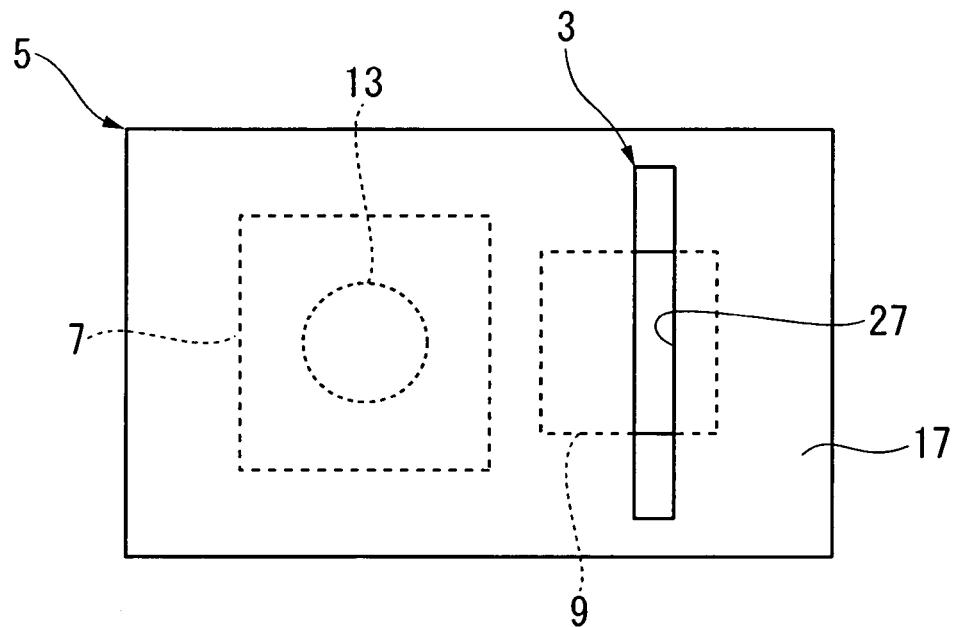
FIG. 3 is a plan view showing that the opening is formed using a through-hole having a thin slit-like shape.

It is possible to modify the opening 3 as shown in FIG. 3, in which the opening 3 is formed using a through-hole 27 having a thin slit-like shape, which is further reduced in width compared with the through-hole 25 shown in FIG. 2. For example, when the area of the opening 3 is set to 0.785 mm$^2$, the through-hole 27 is designed with a length of 2.6 mm and a width of 0.3 mm; that is, the through-hole 27 designed with prescribed dimensions in which the ratio between the length and the width is approximately set to 9:1, wherein the width of the through-hole 27 is reduced to be smaller than a half of the diameter of the conventionally-known circular opening.

In order to further increase the area of the opening 3 that is formed using the through-hole 25 or 27, it is possible to increase only the length without changing the width.

In the semiconductor device 1 in which the opening 3 is formed using the through-hole 25 or 27 having a thin slit-like shape, it is possible to adequately secure a sufficiently large area of the opening 3 while reducing the width of the through-hole 25 or 27. This makes it possible for pressure variations to be reliably transmitted to the microphone chip 7 inside of the cavity S via the opening 3.

By reducing the width of the through-hole 25 or 27, it is possible to easily prevent dust from entering into the cavity S. Since the opening 3 is not positioned directly opposite to the microphone chip 7, even when sunlight is incident on the opening 3 and is then introduced inside of the cavity S, it is possible to reliably prevent sunlight from reaching the microphone chip 7. That is, it is possible to remarkably reduce negative influences due to environmental factors such as sunlight and dust with respect to the microphone chip 7.

Since the longitudinal direction of the through-hole 25 or 27 is substantially perpendicular to the radial direction of the diaphragm 13, it is possible to form the opening 3 at a desired position deviating from the diaphragm 13 of the microphone chip 7 without increasing the size of the housing 5, thus realizing downsizing of the semiconductor device 1.

Figure 4:
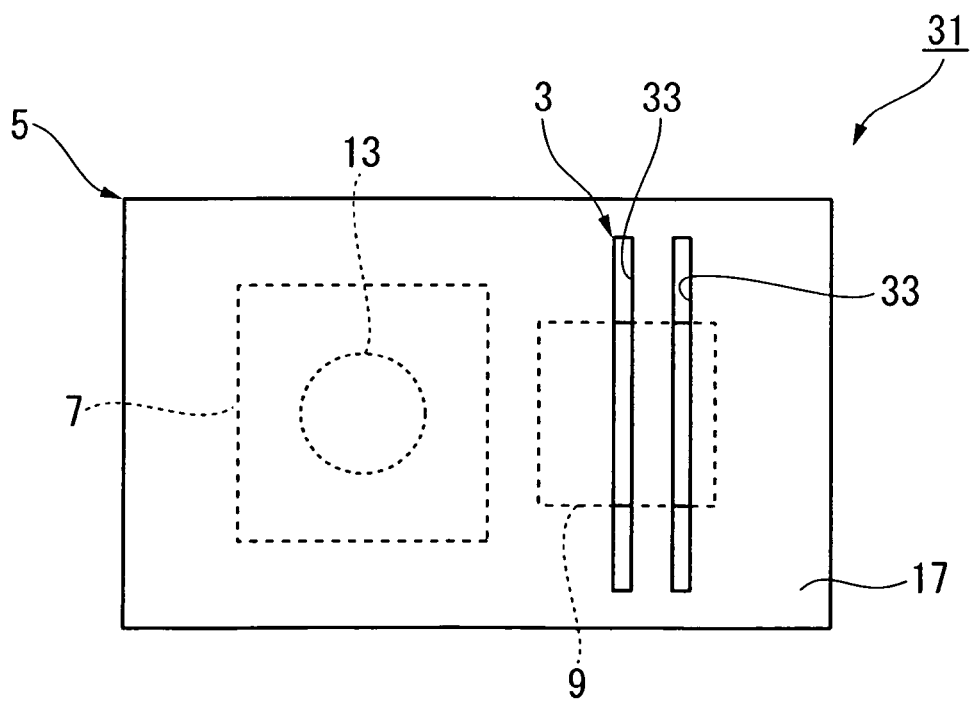
FIG. 4 is a plan view showing that the opening is formed using two through-holes each having a thin slit-like shape.
Figure 5:
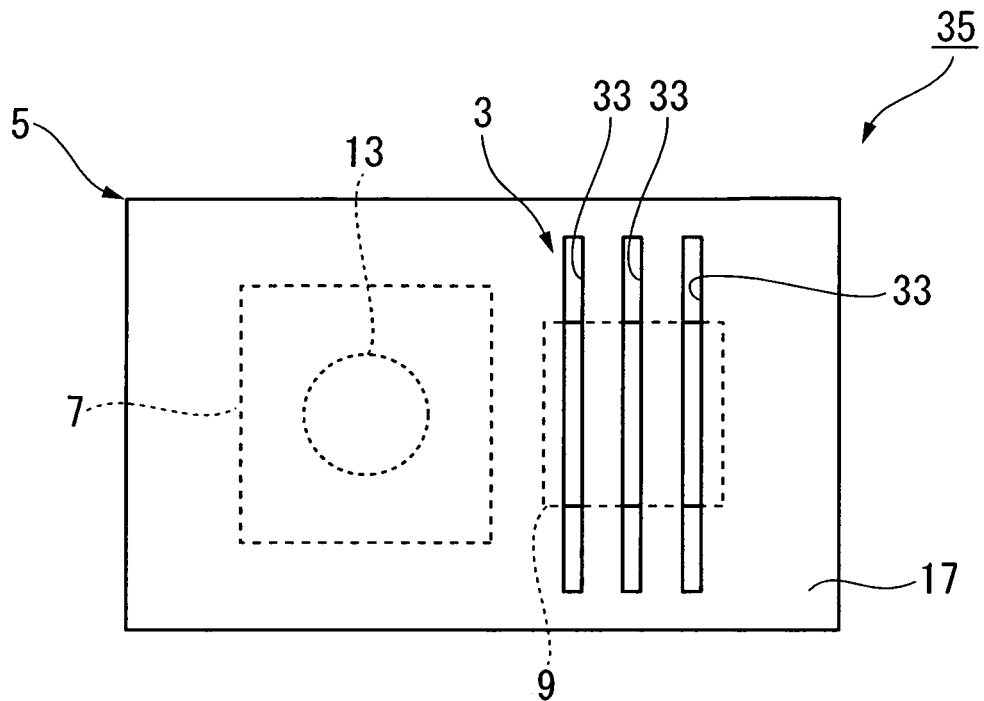
FIG. 5 is a plan view showing that the opening is formed using three through-holes each having a thin slit-like shape.

The semiconductor device 1 is designed such that the opening 3 is formed using a single through-hole 25 or 27; but this is not a restriction. For example, as shown in FIGS. 4 and 5, the opening 3 can be divided into plural through-holes 33, each of which has a thin slit-like shape and which are aligned in parallel with each other. Herein, it is preferable that all the through-holes 33 not be positioned opposite to the microphone chip 7. In addition, it is preferable that the through-holes 33 be collectively formed in a prescribed region of the top board member 17, which is positioned opposite to the LSI chip 9, or its adjacent region.

In a semiconductor device 31 shown in FIG. 4, two through-holes 33 each having a thin slit-like shape are arranged in parallel with each other in the width direction so as to form the opening 3. In a semiconductor device 35 shown in FIG. 5, three through-holes 33 each having a thin slit-like shape are arranged in parallel with each other in the width direction so as to form the opening 3. It is preferable that the alignment direction of the through-holes 33 substantially match the radial direction of the diaphragm 13, i.e., the alignment direction of the microphone chip 7 and the LSI chip 9. It is preferable that the distance between the through-holes 33 adjoining each other be as small as possible. Incidentally, the radial direction of the diaphragm 13 is defined as a direction from the diaphragm 13 to the through-holes 33 in plan view.

In the semiconductor devices 31 and 35 shown in FIGS. 4 and 5, it is possible to further reduce the width of the through-hole 33 without changing the overall area of the opening 3 (i.e., a sum of the opening areas of the through-holes 33). In the semiconductor device 31 shown in FIG. 4, when the overall area of the opening 3 is set to 0.785 mm$^2$, each of the through-holes 33 is designed with a length of 2.65 mm (which is similar to the length of the through-hole 27 shown in FIG. 3) and a width of 0.15 mm (which is smaller than the width of the through-hole 27); that is, each of the through-holes 33 is designed with prescribed dimensions in which the ratio between the length and the width is approximately set to 18:1. In the semiconductor device 35 shown in FIG. 5, when each of the through-holes 33 is designed with the aforementioned length and width, it is possible to increase the overall area of the opening 33 to 1.17 mm$^2$.

In the semiconductor devices 31 and 35 shown in FIGS. 4 and 5, even when the through-holes 33 are each reduced in the opening area thereof, it is possible to adequately secure the total opening area for the opening 3. This allows pressure variations (e.g., sound pressure variations) to be introduced into the cavity S from the opening 3 and to reliably reach the microphone chip 7. By collectively arranging the plural through-holes 33 within a prescribed area, it is possible to secure substantially the same effects of the foregoing examples, in which only the through-holes 25 and 27 are formed, so as to reliably introduce pressure variations into the cavity S.

The semiconductor devices 31 and 35 shown in FIGS. 4 and 5 can demonstrate outstanding effects similar to the foregoing effects realized by the semiconductor device 1. Since the plural through-holes 33 are closely arranged to adjoin together in the width direction, it is possible to minimize the prescribed region of the top board member 17 used for the formation of the through-holes 33. In other words, it is possible to reduce the size of the housing 5, thus downsizing the semiconductor devices 31 and 35. Since each of the through-holes 33 is reduced in the opening area thereof, it is possible to further reduce negative influences due to environmental factors with respect to the microphone chip 7.

The aforementioned through-holes having thin slit-like shapes are not necessarily limited in lengths, whereas widths thereof should be preferably set to 0.3 mm or less, and more preferably, widths thereof should be set to 0.2 mm or less.

Figure 6:
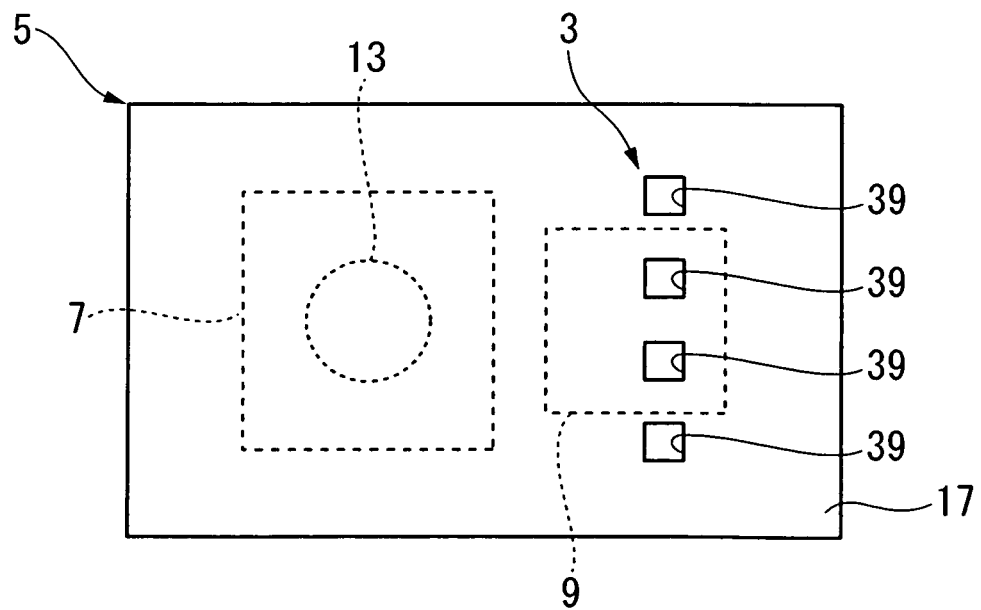
FIG. 6 is a plan view showing that the opening is formed using four square-shaped through-holes aligned in a single line.
Figure 7:
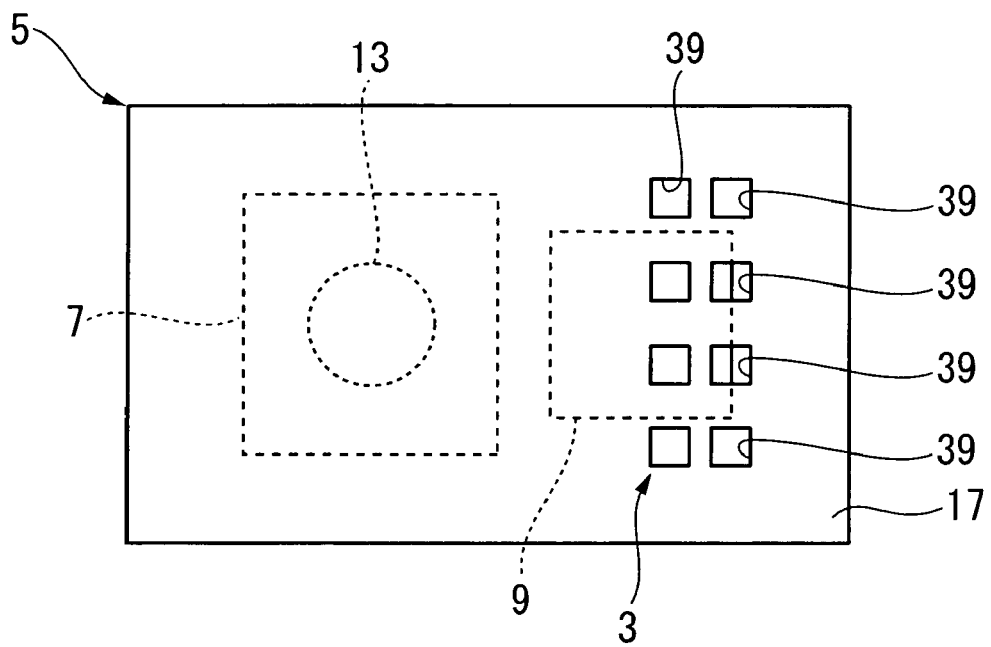
FIG. 7 is a plan view showing that the opening is formed using eight square-shaped through-holes, which are aligned in two lines adjoining together.

The opening 3 is not necessarily divided into the plural through-holes 33 each having a thin slit-like shape. For example, as shown in FIGS. 6 and 7, the opening 3 can be divided into plural square-shaped through-holes 39. Alternatively, the opening 3 can be divided into plural circular through-holes 43 as shown in FIG. 8.

In the case of FIG. 6, plural square-shaped through-holes 39 are formed in a prescribed region of the top board member 17 and are aligned in a single line, which lies in a direction perpendicular to the alignment direction of the microphone chip 7 and the LSI chip 9. In the case of FIG. 7, plural square-shaped through-holes 39 are aligned in two lines, which adjoin each other. In the case of FIG. 8, plural circular through-holes 43 are aligned in three lines, which adjoin each other.

Figure 8:
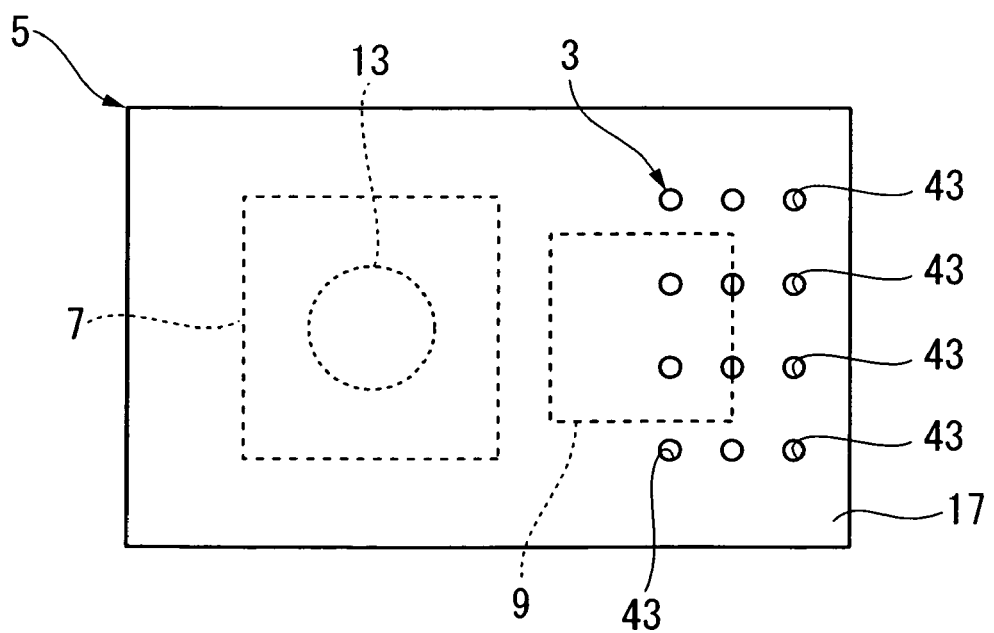
FIG. 8 is a plan view showing that the opening is formed using twelve circular through-holes, which are aligned in three lines adjoining together.

Although each of the through-holes 43 shown in FIG. 8 has a circular shape similar to the conventionally-known opening, each of them has a very small diameter compared with the diameter of the conventionally-known opening. Suppose that the opening 3 is formed using two circular through-holes 43, and the overall area of the opening 3 is set to 0.78 mm². In this case, the diameter of each through-hole 43 is set to approximately 0.71 mm. When the opening 3 is formed using four through-holes 43, the diameter of each through-hole 43 is set to 0.5 mm.

Figure 9:
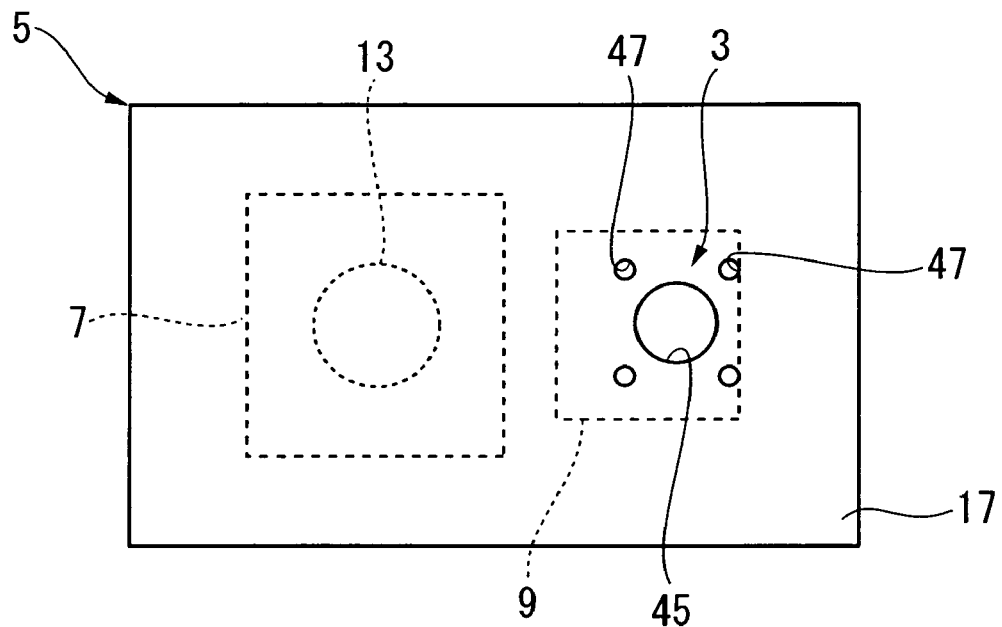
FIG. 9 is a plan view showing that the opening is formed using four small circular through-holes and one large circular through-hole, which collectively adjoin together.

The opening 3 of the housing 5 is not necessarily formed using the plural through-holes 33, 39, and 43 each having the same opening area as shown in FIGS. 4 to 8. For example, as shown in FIG. 9, the opening 3 can be formed using different through-holes 45 and 47 whose opening areas differ from each other. Specifically, four circular through-holes 47 each having a relatively small diameter are arranged in the surround area of a single circular through-hole 45 having a relatively large diameter, thus forming the opening 3.

Figure 10:
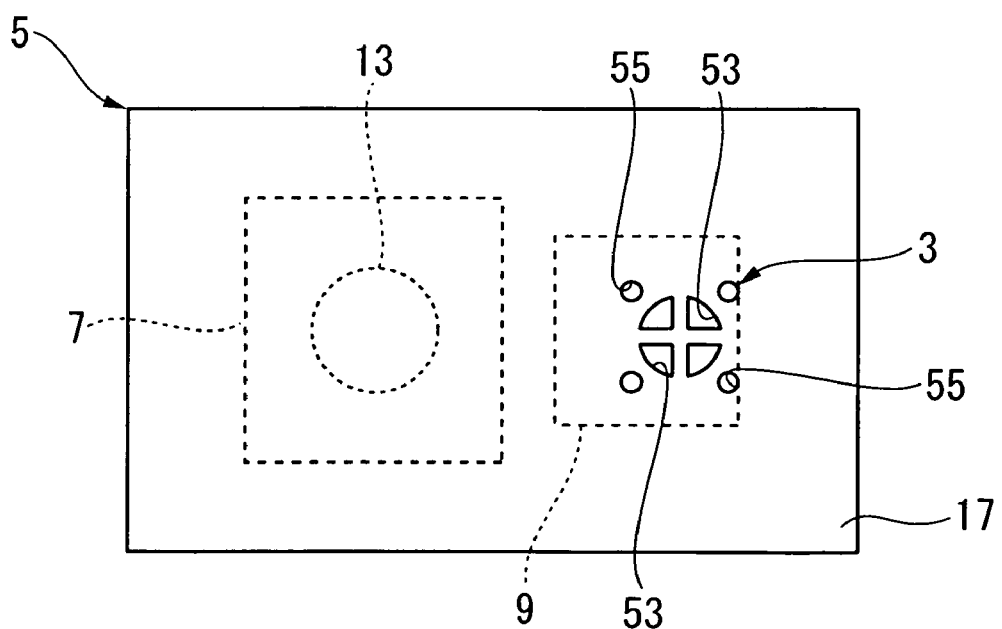
FIG. 10 is a plan view showing that the opening is formed using four small circular through-holes and four sectorial through-holes, which collectively adjoin together.

The opening 3 of the housing 5 is not necessarily formed using the plural through-holes 33, 39, 43, 45, and 47 each having the same shape; hence, it can be formed using different types of through-holes having different shapes, which are combined together. For example, as shown in FIG. 10, four circular through-holes are arranged in the surrounding area of four sectorial through-holes, which adjoin together in a circular region.

The semiconductor devices shown in FIGS. 6 to 10 can demonstrate outstanding effects similar to the foregoing effects realized by the semiconductor devices 31 and 35 shown in FIGS. 4 and 5.

In the present embodiment and its variations, the opening 3 is formed at a prescribed position of the top board member 17 opposite to the LSI chip 7; but this is not a restriction. It is simply required that the opening 3 not be positioned directly opposite to the microphone chip 7 in the housing 5. That is, the opening 3 can be formed in the side wall member 19, or it can be formed in a prescribed region of the chip mount surface 15a of the substrate 15, in which the microphone chip 7 and the LSI chip 9 are not arranged.

In the above, it is preferable to form plural through-holes in a prescribed region in the housing 5, thus forming the opening 3. Herein, it is preferable that plural through-holes be collectively arranged in a concentrated manner with a small distance therebetween.

In the present embodiment and its variations, the housing 5 is constituted of three parts, i.e., the substrate 15, the top board member 17, and the side wall member 19; but this is not a restriction. It is simply required that the housing 5 include the hollow cavity S, the opening 3 allowing the cavity to communicate with the external space, and the chip mount surface 15a for mounting the microphone chip 7 and the LSI chip 9. For example, the side wall member 19 can be formed integrally with the substrate 15 in such a way that the side wall member 19 forms the multilayered wiring substrate together with the substrate 15. Alternatively, the side wall member 19 can be formed integrally with the top board member 17 in such a way that the side wall member 19 forms the cover member for covering the chip mount surface 15a of the substrate 15 together with the top board member 17.

The housing 5 is not necessarily designed to have the opening 3. It is simply required that the housing 5 be formed in a desired structure reducing negative influences due to environmental factors such as sunlight and dust with respect to the microphone chip 7. Instead of forming the opening 3, both the top board member 17 and the side wall member 19 forming the cover member are entirely formed using a porous material; or they are partially formed using a porous material.

The porous material includes numerous small cavities, which mutually communicate with each other and by which the cavity S of the housing 5 communicates with the external space. As the porous material, it is possible to list resin materials and ceramics as well as their composite materials.

In the semiconductor device whose cover member is composed of the porous material, pressure variations such as variations of sound pressure, which occur outside of the housing 5, propagate through small cavities included in the "porous" cover member and are then introduced into the cavity S to reach the microphone chip 7. In order to smoothly introduce pressure variations into the cavity S of the housing 5, it is preferable that the diameter of each small cavity range from 1 μm to 5 μm.

Since the cover member is composed of the porous material, it is possible to easily prevent dust from entering into the cavity S of the housing 5, and it is possible to easily prevent sunlight from propagating into the cavity S of the housing 5. This may substantially eliminate negative influences due to environmental factors with respect to the microphone chip 7.

In the present embodiment and its variations, the LSI chip 9 is arranged inside of the housing 5; but this is not a restriction. It is simply required that at least the microphone chip 7 be arranged inside of the housing 5. That is, the LSI chip 9 can be independently mounted on another circuit board (not shown) for mounting the semiconductor device 1.

The semiconductor device 1 of the present embodiment includes the microphone chip 7 serving as a semiconductor sensor chip; however, this is not a restriction in the present invention. The aforementioned openings illustrated in various figures are adaptable to any types of semiconductor packages including semiconductor sensor chips for sensing high frequencies, which are higher than audio frequencies. That is, it is possible to use ultrasonic sensors serving as semiconductor sensor chips, for example. In this case, plural openings are formed in a semiconductor package so as to prevent dust from unexpectedly entering therein and so as to increase Helmholtz resonation frequencies; hence, it is possible to provide an ultrasonic sensor package having a good sensitivity for sensing high-frequency ultrasonic waves.

Now, a Helmholtz resonator will be explained. In general, the Helmholtz resonator is formed using a closed space (e.g., the cavity S of the present embodiment) and a short pipe (e.g., an opening). This can be applied to the semiconductor package of the present embodiment in such a way that a closed space is formed using the cavity S of the semiconductor package having a volume V; a short pipe constituted of plural circular openings each having a radius r is formed in a top board having a thickness Tb; the total sectional area of the openings is set to Sb; and the cavity S of the semiconductor package communicates with the external space via the openings.

When sound pressure is applied to the inlet of the opening from the external space, the medium (e.g., air) of the opening is subjected to integral motion so as to cause pressure variations in the medium (e.g., air) of the cavity S. This phenomenon may be interpreted as a mass-spring dynamics model in which a mass point (or a material point) is regarded as the air of the opening, a spring is regarded as pressure variations due to volume variations of the air in the cavity S, wherein resonance (or sympathy) occurs at a certain frequency (referred to as a Helmholtz resonance frequency Fh (Hz)).

In the above, the Helmholtz resonance frequency Fh (Hz) can be expressed in the form of the following equation (1), in which the speed of sound C is set to 340000 (mm/s), and the units of length is set to milli-meter (mm).

$$Fh = \frac{C}{2\pi}\sqrt{\frac{Sb}{V(Tb+1.6r)}} \quad (1)$$

The aforementioned equation (1) proves it possible to change the Helmholtz resonance frequency Fh by changing the total sectional area Sb of the plural openings, the radius r of each opening, the thickness Tb of the top board, and the volume V of the cavity S of the semiconductor package.

On the other hand, there is a technological limitation for changing the Helmholtz resonance frequency Fh by reducing the size of the semiconductor package (thus reducing the volume V of the cavity S and the thickness Tb of the top board). In order to further increase the Helmholtz resonance frequency Fh, it is necessary to reduce the radius r of each opening but to increase the total sectional area S of the openings.

A microphone package according to the present invention, which is a small-size semiconductor package, is capable of increasing the Helmholtz resonance frequency Fh to be higher than audio frequencies by providing plural openings and by increasing the total sectional area Sb of the plural openings; hence, it is possible to establish uniformity with regard to the sensitivity. That is, it is possible to provide a microphone package having a good sensitivity for sensing high frequencies.

In the case of semiconductor packages including semiconductor sensor chips such as ultrasonic sensors for sensing high frequencies higher than audio frequencies, it is necessary to increase the Helmholtz resonance frequency to be higher than sensible frequency bands of ultrasonic sensors. This requires the opening(s) to be further increased rather than the opening(s) of the aforementioned microphone package. Providing a large opening may cause negative influences due to environmental factors such as dust and sunlight affecting on semiconductor sensor chips. To solve such a disadvantage, the aforementioned semiconductor package of the present embodiment having plural openings is applied to ultrasonic sensors so as to increase the Helmholtz resonance frequency to be higher than sensible frequency bands of ultrasonic sensors while avoiding negative influences due to environmental factors. Thus, it is possible to establish uniformity regarding sensitivity; and it is possible to provide an ultrasonic sensor package having a good sensitivity for sensing high-frequency ultrasonic waves.

Lastly, the present invention is not necessarily limited to the present embodiment and its variations, which can be further modified in a variety of ways within the scope of the invention defined by appended claims.

What is claimed is:

1. A semiconductor device comprising:
   a semiconductor sensor chip for detecting variations in pressure;
   a housing having a cavity, within which the semiconductor sensor chip is disposed; and
   a plurality of through-holes which are collectively formed in a prescribed region of the housing, said region being disposed at a position other than opposite to the semiconductor sensor chip, wherein the through-holes allow pressure variations external to the cavity to be transmitted to the semiconductor sensor chip.

2. A semiconductor device according to claim 1, wherein each through-hole has a thin slit-like shape.

3. A semiconductor device according to claim 2, wherein the through-holes are parallel to each other.

4. A semiconductor device according to claim 2, wherein a length of each of the through-holes is larger than three times a width of the through-hole.

5. A semiconductor device according to claim 2, wherein a width of each of the through-holes is 0.3 mm or less.

6. A semiconductor device according to claim 1, wherein the housing has at least a top and bottom, the semiconductor sensor chip being disposed on the bottom of the housing.

7. A semiconductor device according to claim 6, wherein the plurality of through-holes are formed in the top of the housing.

8. A semiconductor device comprising:
   a semiconductor sensor chip for detecting variations in pressure;
   a substrate having a chip mount surface for mounting the semiconductor sensor chip; and
   a cover member which in combination with the substrate forms a cavity within which the semiconductor sensor chip is disposed, wherein at least a prescribed part of the cover member is composed of a porous material so that pressure variations external to the cavity are transmitted to the semiconductor sensor chip.

9. A semiconductor device comprising:
   a semiconductor sensor chip for detecting variations in pressure;
   a housing having a cavity within which the semiconductor sensor chip is disposed; and
   a plurality of through-holes formed in the housing so that pressure variations external to the cavity are transmitted to the semiconductor sensor chip, each through-hole being positioned in the housing such that a line extending through an axis of the through-hole does not intersect the semiconductor sensor chip.

10. A semiconductor device according to claim 9, wherein the housing has at least a top and bottom, the semiconductor sensor chip being disposed on the bottom of the housing.

11. A semiconductor device according to claim 10, wherein the plurality of through-holes are formed in the top of the housing.

* * * * *